United States Patent
Gao

(10) Patent No.: US 11,449,112 B1
(45) Date of Patent: Sep. 20, 2022

(54) INTEROPERABLE POWER DELIVERY MODULE FOR SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/206,758

(22) Filed: Mar. 19, 2021

(51) Int. Cl.
*H05K 7/14* (2006.01)
*G06F 1/18* (2006.01)

(52) U.S. Cl.
CPC ............ *G06F 1/188* (2013.01); *G06F 1/189* (2013.01); *H05K 7/1492* (2013.01); *H05K 7/1487* (2013.01)

(58) Field of Classification Search
CPC ....... G06F 1/188; G06F 1/189; H05K 7/1492; H05K 7/1497; H05K 7/16; H05K 7/183; H01R 25/14; H01R 35/04
See application file for complete search history.

(56) References Cited

U.S. PATENT DOCUMENTS

| | | | | |
|---|---|---|---|---|
| 6,498,716 B1 * | 12/2002 | Salinas | ................. | G06F 1/189 439/341 |
| 7,581,972 B2 * | 9/2009 | Daamen | ............. | H01R 13/6315 439/249 |
| 10,164,373 B1 * | 12/2018 | Cheon | ................. | H01R 13/005 |
| 2016/0285684 A1 * | 9/2016 | Alshinnawi | ............. | H04L 41/12 |
| 2017/0108899 A1 * | 4/2017 | Thul | .................... | H05K 7/1457 |
| 2017/0164505 A1 * | 6/2017 | Sarti | .................... | H01R 25/142 |
| 2019/0215979 A1 * | 7/2019 | Chen | .................... | H05K 7/1492 |

* cited by examiner

*Primary Examiner* — Adrian S Wilson
*Assistant Examiner* — Gage Crum
(74) *Attorney, Agent, or Firm* — Womble Bond Dickinson (US) LLP

(57) ABSTRACT

Embodiments are disclosed of a power delivery module that includes a power delivery board rotatable between a first orientation and a second orientation about a first axis that is normal to the power delivery board, and rotatable power clip module. Two pairs of electrical contacts are on the board: a first pair, one positive and one negative, and a second pair of electrical contacts, one positive and one negative. The two pairs of contacts are spaced apart from each other on the same side of the board. The rotatable power clip module is coupled to the power delivery board and includes a pair of contacts pads to engage with, and electrically couple to, the first or the second pairs of contacts. A power clip is electrically coupled to each contact pad. The clip module is rotatable about a second axis parallel to, and spaced apart from, the first axis between a first position, where the contact pads engage the first pair of contacts, and a second position where the contact pads engage the second pair of contacts.

20 Claims, 11 Drawing Sheets

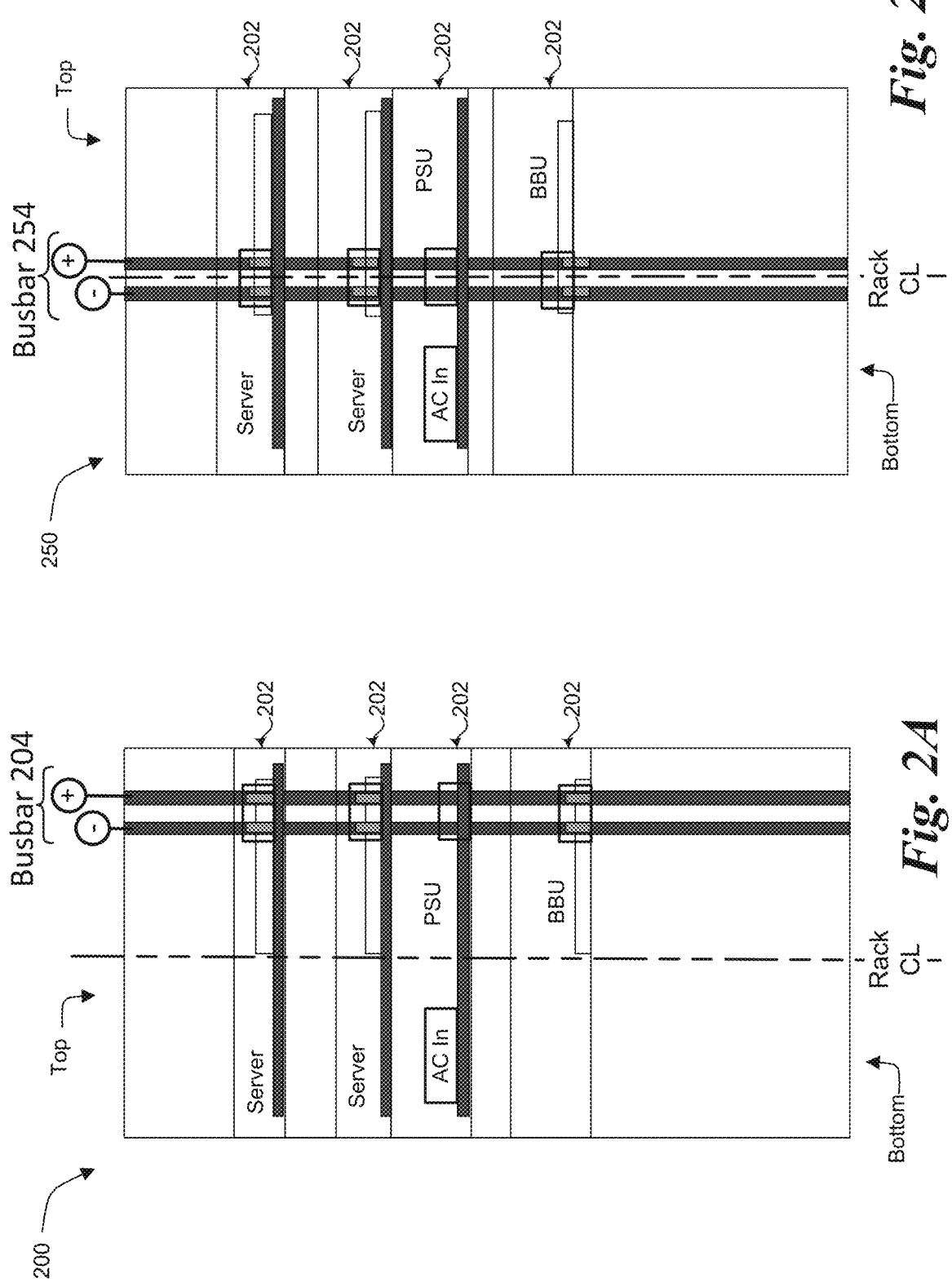

INTEROPERABLE POWER DELIVERY MODULE FOR SERVERS

TECHNICAL FIELD

The disclosed embodiments relate generally to servers and in particular, but not exclusively, to a rotational power delivery module for supplying electric power to a server in a server rack, located in data centers.

BACKGROUND

Modern data centers, such as cloud computing centers, house enormous amounts of information technology (IT) equipment such as servers, blade servers, routers, edge servers, etc. These individual pieces of IT equipment are typically housed in racks within the computing center, with multiple pieces of IT equipment within each rack. The racks are typically grouped into clusters within the data center.

In both public cloud service and private cloud services, service providers might need to relocate servers from one rack cluster to another cluster within the same data center, or might even need to relocate and migrate servers from one data center site to another in a different geographic location. Relocating a server means moving it from one rack to another, but different data centers, and even different clusters within the same data center, can use different types of racks. This can create difficulties because the design of the IT equipment must be compatible with the rack in which it is installed.

There are many different rack configurations, but although there are some industry standards—examples include OCP open racks, ODCC Scorpio racks, and so on—there can still be large configuration differences between rack standards; the racks differ in form factor, power delivery design, cooling method, and so on. This means IT equipment such as servers must be compatible with multiple rack specifications before they can be housed in a wide variety of racks; if not compatible, the IT equipment can be difficult to implement, and might not function properly, on different types of racks. This significantly limits the server and system designs and is a challenge to OEM vendors, rack vendors, server vendors, component suppliers, and the end users. Hardware cost is critical for cloud services businesses and internet services businesses, and interoperability is an important feature for reducing hardware cost. Previous IT equipment designs allow the design to be used only in one or a small number or rack types. This lack of interoperability is a major shortfall.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are rear views of embodiments of information technology (IT) racks.

FIG. 3A is a plan view, FIG. 3B is a cross-sectional view taken substantially along section line B-B in FIG. 3A.

FIG. 3D is a plain view, FIG. 3E a cross-sectional view taken substantially along section line E-E in FIG. 3D.

DETAILED DESCRIPTION

Figure 1:
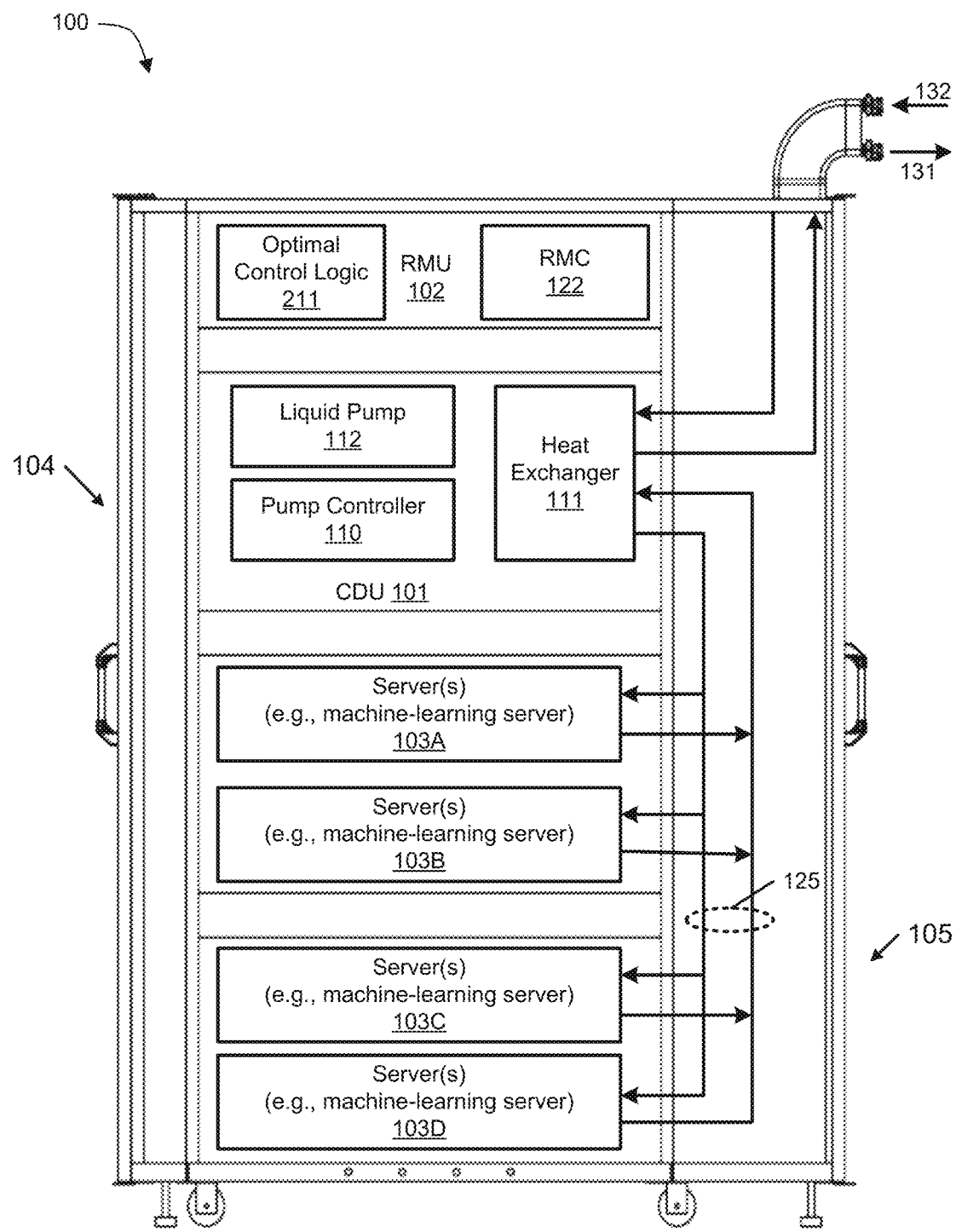
FIG. 1 is a side view of an embodiment of an information technology (IT) rack populated with various IT devices.

Embodiments are described of a rotational power delivery module for supplying electric power to a piece of IT equipment in an IT rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiments are described below of a rotational power delivery module having a rotatable power distribution board and a rotatable power clip module. The power distribution board is rotatable relative to a server chassis, and the power clip module is rotatable relative to the power distribution board. A safety pin or screw is used to ensure the power delivery module is retained in the proper orientation. The combined rotation of these two elements enables the power clip module to match different busbar architectures and locations in different racks while also ensuring that the corresponding positive and negative connections match the busbar designs. In operation, the power deliver board rotates 180 degrees and then the power clip module rotates 180 degrees. These two 180 degree rotations enable the power module to be adjusted to match different rack power architectures. Thus, the described embodiments improve the server and rack interoperability and enable dynamic adjustment of the server power delivery system location to assist forming better airflow within the server chassis. The described embodiments also improve serviceability of the power delivery design because, among other things, they can be operated without tools—i.e., the embodiments do not require physical hardware tools to operate or to service. To further improve serviceability, or reduce the need for service, the described embodiments include features that prevent improper operation.

Embodiments of the power distribution module (PDM) are integrated on a PDM chassis, and the PDM chassis is integrated and fixed onto an IT chassis. The PDM includes a power delivery board (PDB) with two sets of power connections, each set connected to power electronics packaged on the PDB. Each set of power connections includes one positive and one negative connections. A power clip module is attached onto the PDB. The power clip module is packaged with power connectors as well as power clips; these power connectors and clips are for connecting the electrical circuits between the rack power busbar and the PDB. Part of the clip module is designed for conducting current and part of the clip module is insulated and non-conductive. The conductive part of the clip module can connect to either set of power connection on the PDB to connect to the PDB and the corresponding power electronics. The PDB can be rotated 180° and the clip module can be rotated 180°, so that the PDM is interoperable among different rack configurations.

FIG. 1 is a block diagram illustrating a side view of an embodiment of an electronics rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a power deliver module, such as the ones shown in FIG. 3A et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

FIGS. 2A-2B illustrate embodiments of busbars in information technology (IT) racks. Both FIGS. 2A and 2B show racks when viewed from the rear. FIG. 2A illustrates an embodiment of a rack 200 having one or more pieces of IT equipment 202 housed therein in a vertical stack. Although IT equipment 202 is described below mainly as servers, in various embodiments IT equipment 202 can be any type of IT equipment that can be housed in a rack; examples include servers, graphics processing units (GPUs), power units, battery backup (BBU) units, power supply units (PSUs), cooling units, or some combination of these (see, e.g., FIG. 1). To provide electrical power to all the IT equipment in the rack, or all IT equipment that could be housed in the rack, busbar 204 extends over substantially the entire height of the rack, from bottom to top. Busbar 204 includes two bars that act as electrical contacts: a positive (+) bar and a negative (−) bar. It is an industry standard that the positive bar is on the right and the negative bar on the left, again when viewed from the rear of the rack. In the illustrated embodiment, busbar 204 is positioned to the right of the rack centerline, near the right side of the rack when viewed from the rear.

FIG. 2B illustrates an embodiment of a rack 250. Rack 250 is in most respects similar to rack 200: it has one or more servers 202 housed therein in a vertical stack and includes a busbar 254 that extends over substantially the entire height of the rack, from bottom to top, to supply electrical power to all servers that are or could be housed in the rack. Like busbar 204, busbar 254 includes two bars that server as electrical contacts: a positive (+) bar and a negative (−) bar, with the positive bar on the right and the negative bar on the left when viewed from the rear of the rack. The primary difference between racks 200 and 250 is the position of the busbar: instead of being to the right of the rack centerline, busbar 254 is positioned substantially along the centerline of the rack. To allow IT equipment 202 to be easily moved from rack 200 to rack 250, or the other way around, the servers 202 or the racks must include a power delivery module that can adapt to different busbar positions.

Figure 3A:
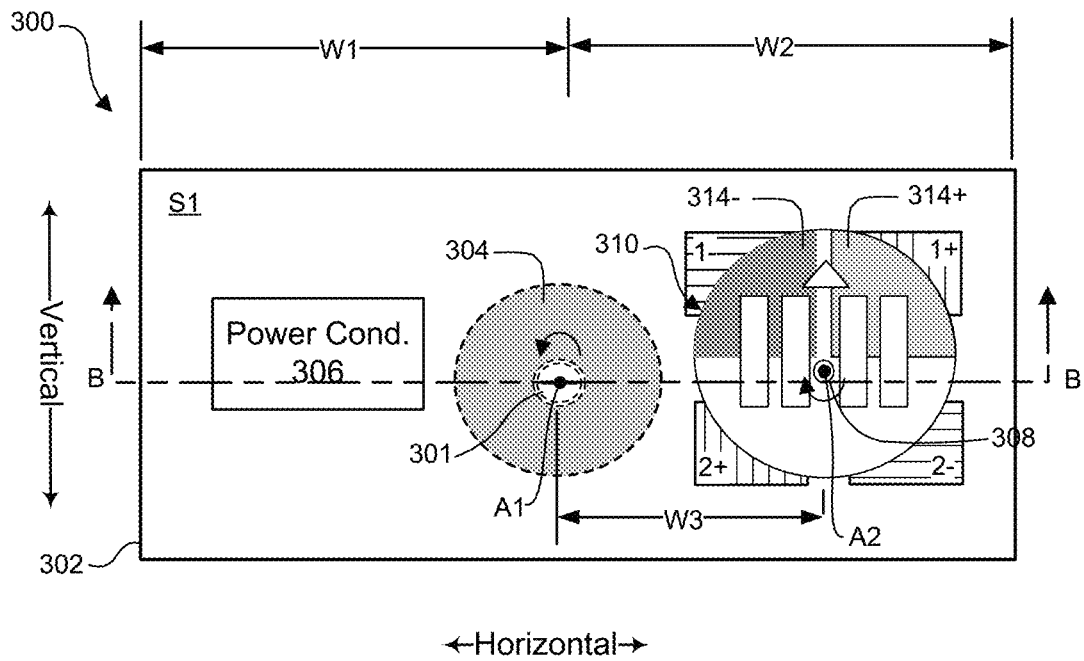
FIGS. 3A-3B are views of an embodiment of a power delivery module.
Figure 3B:
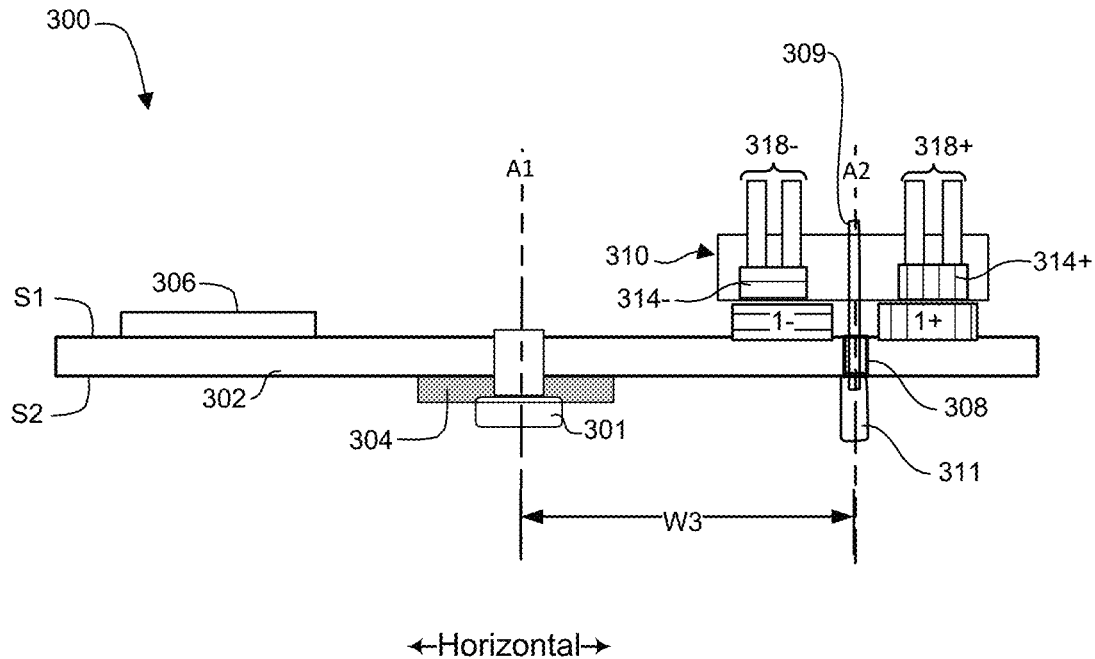

FIGS. 3A-3F together illustrate an embodiment of a power delivery module 300. FIGS. 3A-3B together illustrate the assembled power delivery module. Power delivery module 300 has two main parts: power delivery board 302 and power clip module 310.

Power delivery board 302 has a first side or surface S1 (see FIG. 3A) and a second side or surface S2 (see FIG. 3B). In one embodiment, first side S1 and second side S2 are planar, substantially parallel to each other, are spaced apart from each other by a thickness of board 302. In one embodiment board 302 is a printed circuit board, but in other embodiments it can be another type of board. In the illustrated embodiment a positioning screw or pin 301 is used to attach board 302 to a power delivery module (PDM) chassis and to hold board 302, and hence power delivery module 300, in a specific orientation (see FIGS. 4A-4B). In other embodiments the mounting method may be different, so that positioning screw 301 may be slightly different or, in some applications, may be unnecessary.

Board 302 is rotatable about a first axis A1. In the illustrated embodiment first axis A1 is substantially normal to the plane of board 302 and substantially in the middle of the board (i.e., W1=W2), but in other embodiments first axis A1 need not be normal to the plane of board 302 and need not be positioned in the middle of the board (i.e., W1≠W2). Positioning screw 301 and output connector 304 are centered on axis A1 and are mounted on second side S2; output connector 304 can be used to connect power delivery module 300 to the main board of a piece of IT equipment such as a server (see, e.g., FIGS. 4A-4B).

First side S1 of board 302 includes two pairs of electrical contacts: a first pair of spaced-apart electrical contacts, including a first negative contact (1−) and a first positive contact (1+), and a second pair of spaced-apart electrical contacts including a second negative contact (2−) and a second positive contact (2+). In other embodiments, for each pair of electrical contacts the negative and positive contacts maybe packaged together as a single module.

Figure 3C:
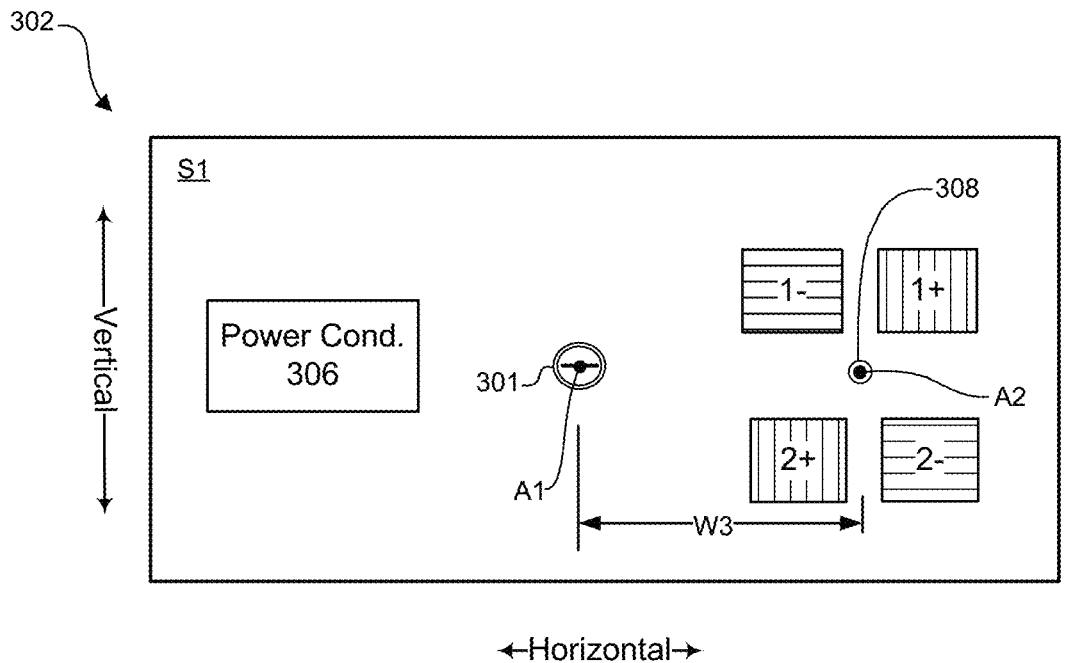
FIG. 3C is a plan view of an embodiment of a power delivery board that forms part of the power delivery module of FIG. 3A.

A clip mounting channel 308, best seen in FIG. 3C, is formed or attached to board 302 normal to the plane of the board, and the mounting channel is positioned between the positive and negative electrical contacts in each of the two pairs of electrical contacts. Clip mounting channel 308 is designed to rotatably receive clip module 310 so that the clip module can rotate about a second axis A2 defined by the clip mounting channel and/or a shaft of the clip module. In the illustrated embodiment, second axis A2 is substantially parallel to first axis A1 and is spaced apart from the first axis by a non-zero distance W3. Generally, it is desirable that W3 be half the distance between busbars in two rack configurations in which the power delivery module will be used. For instance, in an embodiment for use with the rack configurations shown in FIGS. 2A-2B, W3 can be half the distance between the right-side busbar of FIG. 2A and the center busbar of FIG. 2B.

Power clip module 310 has two main parts: a pair of power clips 318+ and 318− that electrically connect to a busbar, and a pair of contact pads 314+ and 314− that electrically couple power clips 318+ and 318− to one of the pair of electrical contacts on board 302—i.e., 1+/1− or 2+/2−. In addition to power clips and contact pads, power clip 310 includes a positioning screw 309 and a positioning nut 311. Power clip module 310 is attached to power delivery board 302 using a positioning screw 309 and positioning nut 311. Positioning screw 309 is inserted into clip mounting channel 308 and serves as a shaft around which power clip module 310 can rotate. Positioning screw 309 and positioning nut 311 together keep power clip module 310 attached to board 302; the screw is inserted into the nut and tightened to hold clip module 310 and board 302 together. In one embodiment, positioning nut 311 can include a flexible structure, such as a spring, to enable clip module 310 to be partially pulled out during rotation operation and then provide an automatically elasticity to pulling the clip module back into place and tighten the board and the clip module together. Further details of clip module 310 are discussed below in connection with FIGS. 3D-3E.

FIG. 3C best illustrates the positioning of the pairs of electrical contacts on board 302. The power delivery board is installed vertically in an IT chassis (see FIGS. 4A-4B), therefore so that figure is a view of the PDB as seen from the rear of the server. As also discussed above, first side S1 includes a first pair of horizontally spaced-apart electrical contacts, including a first negative contact (1−) and a first positive contact (1+). Also on side S1 is a second pair of horizontally spaced-apart electrical contacts, including a second negative contact (2−) and a second positive contact (2+). The first and second pairs of electrical contacts are vertically spaced apart from each other on the board, with first positive contact 1+ directly above second negative contact 2−, and first negative contact 1− directly above second positive contact 2+. Put differently, first positive contact 1+ is diagonally across from second positive contact 2+, and first negative contact 1− is diagonally across from second negative contact 2−. Clip mounting channel 308 is positioned in board 302 in between the pairs of electrical contacts, so that the four electrical contacts and the clip mounting channel together form a quincunx.

Figure 3D:
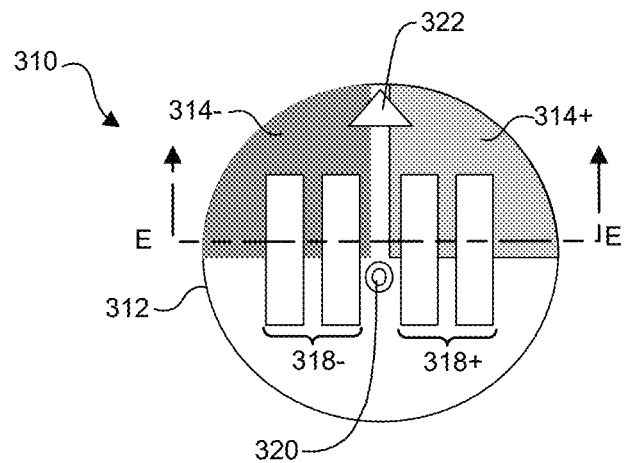
FIGS. 3D-3E are views of an embodiment of a power clip module that forms part of the deli of the power delivery module of FIG. 3A.
Figure 3E:
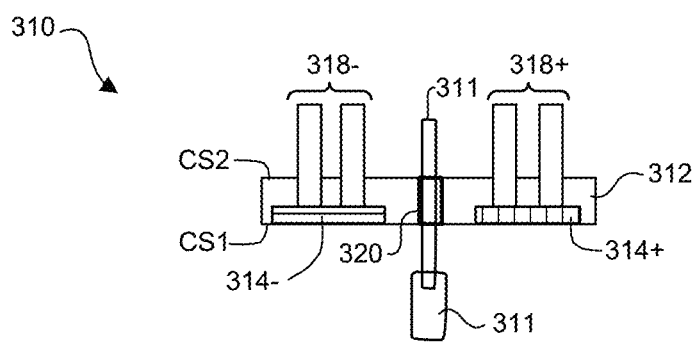

FIGS. 3D-3E illustrate an embodiment of a power clip module 310. FIG. 3D is a plan view, FIG. 3E a cross-sectional view. Power clip module 310 forms the electrical connection between the busbar and the electrical contacts on power delivery module 300. Power clip module 310 includes a clip module substrate 312 having a first side CS1 and a second side CS2. The chip module substrate can be made of any rigid material; in one embodiment, for instance, it can be made of a rigid and electrically insulating material. In other embodiments clip module substrate 312 can be made of an electrically conductive material, provided provisions are made for electrically insulating the contact pads and power clips from each other. In the illustrated embodiment chip module substrate 312 is round, but in other embodiments it can have a different shape, such as quadrilateral (see, e.g., FIG. 3G).

When power clip module 310 is installed on board 302, first side CS1 faces the board (see FIG. 3B). So that they can make electrical contact with one of first electrical contact pair 1+/1− or second electrical contact pair 2+/2−, positive contact pad 314+ and negative contact pad 314− are formed in or on first side CS1. A pair of power clips 318 is formed on second side CS2, with positive clip 318+ being electrically coupled to positive contact pad 314+ and negative power clip 318− being electrically coupled to negative contact pad 314−. Positive contact pad 314+ and negative contact pad 314− are electrically insulated from each other, as are power clips 318+ and 318−. Clip module substrate 312 also includes a hole 320 to receive screw/shaft 309 and rotate about the shaft. In the illustrated embodiment, positive contact pad 314+ and negative contact pad 314− are pie-shaped sectors of a circle, each substantially a quarter of a circle, but in other embodiments positive contact pad 314+ and negative contact pad 314− can have other shapes (see, e.g., FIG. 3G). With this arrangement, at a given time power clips 318+ and 318− will only be electrically coupled, via contact pads 314+ and 314−, to one pair of electrical contacts on board 302—either the first pair of contacts 1+/1− or second pair of contacts 2+/2.

As a safety feature to ensure proper connection of a positive power clip to a positive busbar contact and a negative power clip to a negative busbar contact (see, e.g., FIG. 4B), power clip module 310 includes an installation symbol 322, which is a visual indicator that shows an operator the correct orientation of the power clip module. In the illustrated embodiment, installation symbol 322 is an arrow that points upward (i.e., toward the top of a rack) when the power clip module is correctly oriented. But in other embodiments, of course, other types of visual indicators and with the same or different orientations can be used.

Figure 3F:
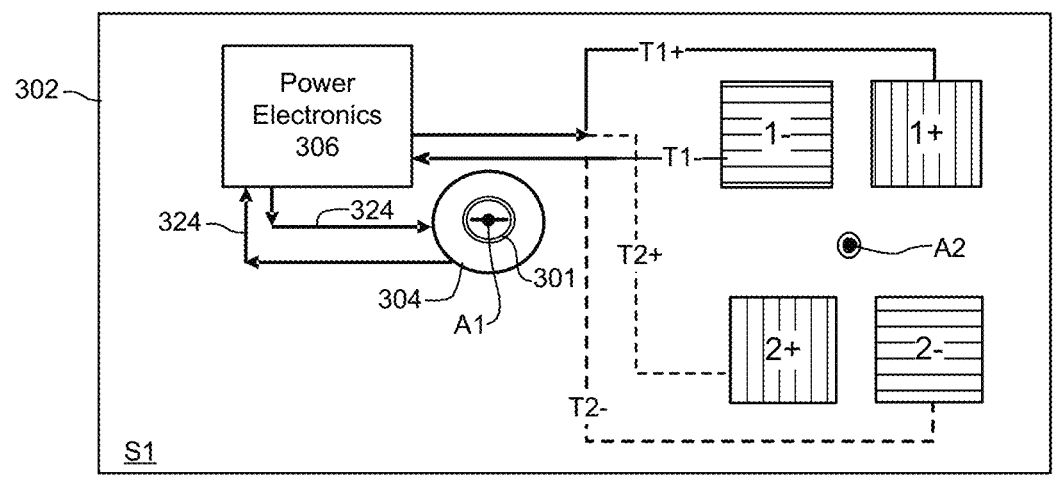
FIG. 3F is a schematic drawing of the electrical connections on an embodiment of the power delivery board.

FIG. 3F illustrates the electrical connections between components on power distribution board 302. Power conditioning electronics 306 are mounted on one of surfaces S1 or S2. In the illustrated embodiment the power conditioning electronics are mounted on surface S1, so that it is shown in solid lines in a view of S1. The power conditioning electronics condition electrical power received from the busbar at one of the two pairs of electrical contacts (1+/1− or 2+/2−) before it is output to the IT equipment through output connector 304. In various embodiments, power conditioning electronics 306 can include voltage regulators, rectifiers, or other power conditioning and control elements.

To ensure that the power electronics 306 can condition power received from electrical contacts 1+/1− or from electrical contacts 2+/2−, board 302 includes traces or connections that electrically couple both the first and second contact pairs to the power conditioning electronics, so that each pair of contacts has its own circuit routing to the power electronics. In the illustrated embodiment trace pair T1, shown in solid lines, electrically couple the first pair of contacts 1+/1−, also shown in solid lines, to the power electronics. Trace pair T1 includes a trace T1+ that is coupled to contact 1+ and a trace T1− that is coupled to contact 1−. Similarly, trace pair T2, shown in dashed lines, electrically couple the second pair of contacts 2+/2− to the power electronics. Trace pair T2 includes a trace T2+ that is coupled to contact 2+ and a trace T2 that is coupled to contact 2−. In different embodiments, trace pairs T1 and T2 can be on the same or different sides, or even within, power delivery board 302. Operation of power clip module 310, further described below, ensures that at any time only one of the two pairs of contacts (first pair 1+/1− or second pair 2+/2−) will direct electrical power to the power electronics. Because output connector 304 will be used to connect the PDB to the IT equipment's main board regardless of the orientation of board 302 (see FIGS. 4A-4B), only a single pair of traces 324 is needed between the power electronics and connector 304.

Figure 3G:
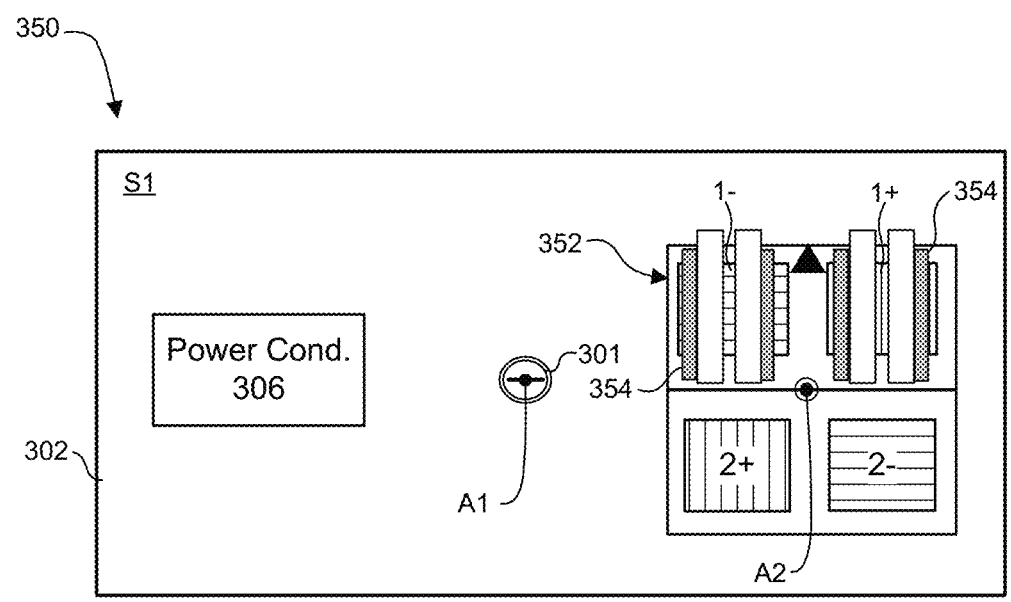
FIG. 3G is a plan view of another embodiment of a power delivery module.

FIG. 3G illustrates another embodiment of a power delivery module 350; some auxiliary structure for assisting the clip module rotation is not show in the figure. Power delivery module 350 is similar in most respects to power delivery module 300. The primary difference between power delivery modules 350 and 300 is the configuration of the power clip module. Power delivery module 350 includes a power clip module 352 that is quadrilateral in shape instead of round. Because of its quadrilateral shape, power clip module 352 also includes quadrilateral contact pads. Power clip module 352 may fully cover both pairs of electrical contacts (1+/1− and 2+/2−) on board 302, making them difficult to see and align properly. To address this problem, power clip module 352 can include a displacement buffer 354 on the two sides of the clips for ease of system installations and reliability enhancement. In additional embodiments, the power clip module can be packaged in different form factors, and multiple clip modules can be put on a power delivery board.

Figure 4A:
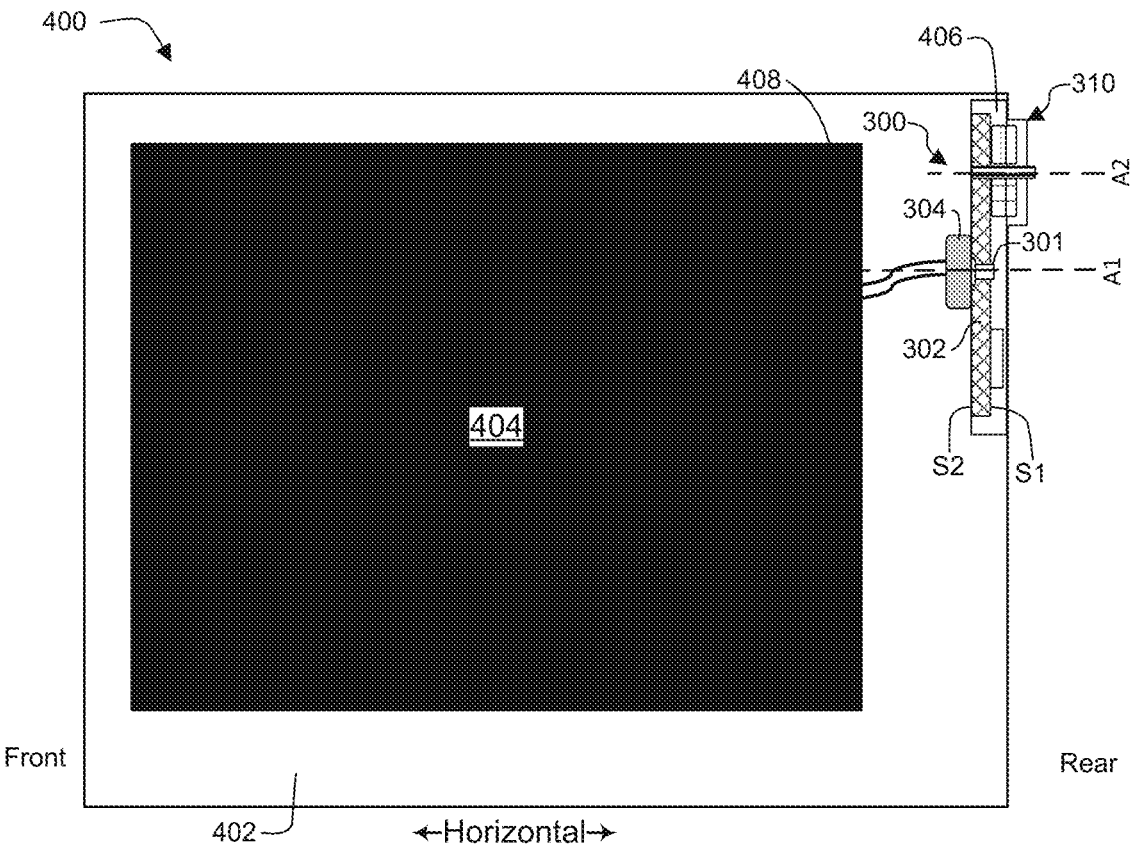
FIGS. 4A-4B are a top view and a side view, respectively, of an embodiment of IT equipment using a power delivery module such as the one shown in FIGS. 3A-3B.
Figure 4B:
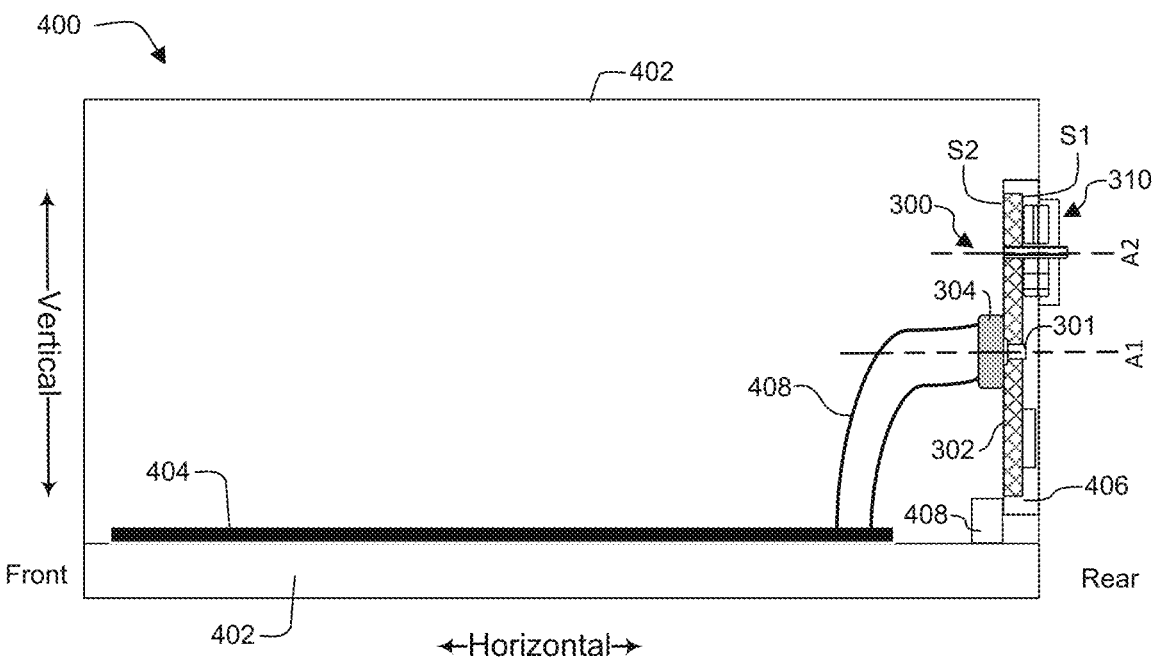

FIGS. 4A-4B together illustrate an embodiment of an IT apparatus 400, such as a server, including a power distribution module such as module 300. FIG. 4A is a plan view, FIG. 4B a side view. IT apparatus 400 includes an IT chassis 402 with a main board 404 housed within. In various embodiments, main board 404 includes multiple electronic components (not shown) that together perform the functions of IT apparatus 400.

A power delivery module (PDM) chassis 406 is also positioned within IT chassis 402 to receive and hold a power delivery module such as power delivery module 300 (see FIGS. 3A-3F). The PDM chassis provides structural support for the entire power module, including supporting the system installation (i.e., mounting and fixing structure). In one embodiment, PDM chassis 406 can be a frame that engages with the edges of power delivery board 302 and with mounting/positioning screw 301, but in other embodiments PDM chassis can be constructed differently. PDM chassis 406 is fixed to IT chassis 402 by support 408 (visible in FIG. 4B), so that PDM chassis 406 is stationary relative to IT chassis 402. PDM chassis 406 is positioned at the rear of chassis 402, so that the power clips on power clip module 310 project from the back of the IT chassis and can be coupled to the busbar of the rack in which IT apparatus 400 is placed. PDM chassis 406 is also positioned so that it holds power delivery module 300 vertically—i.e., with the plane of board 302 positioned vertically or, put differently, with axes A1 and A2 positioned horizontally—so that it can be rotated between different orientations as shown in FIGS. 5A-5C, thus moving power clip module 310 to different positions where it can engage different busbars.

Power delivery module 300 is electrically coupled to main board 404 using wires 408 coupled between output connector 304 and the main board. As a result, a cable or one or more wires 408 can get twisted when the power delivery module 300 is moved from one orientation to another (see, e.g., FIGS. 5A-5C). But the central location of rotatable connector 304 ensures a minimum of disruption to wires 408, and thus a minimum disruption of the power connection to main board 404. In other embodiments, the cable/wire connection can be eliminated with direct blind mating or other such techniques.

Figure 5A:
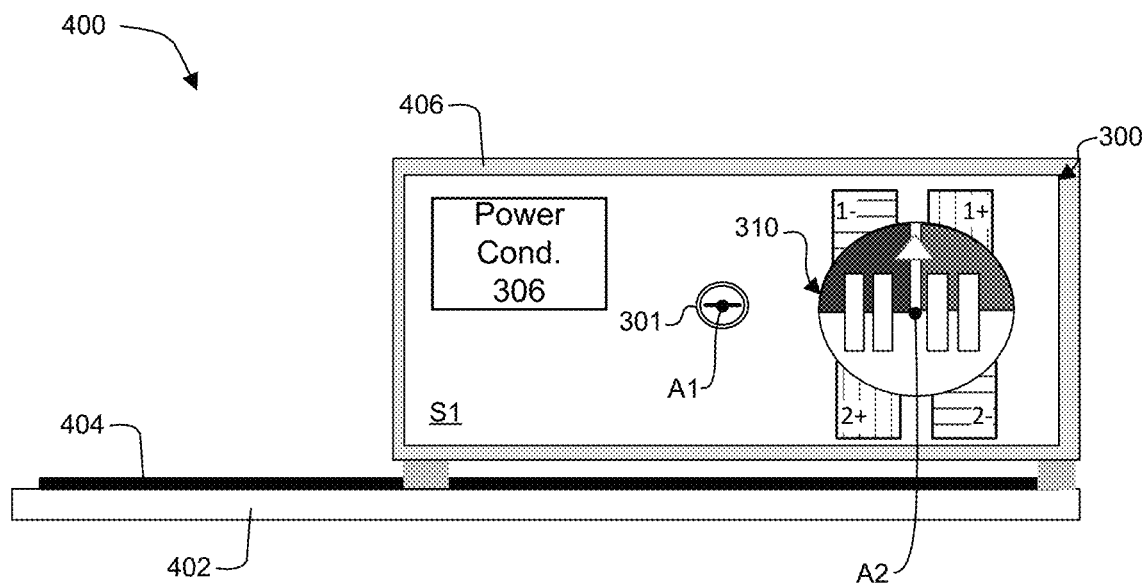
FIGS. 5A-5C are rear views of the power delivery module installation of FIGS. 4A-4B illustrating an embodiment of its operation.
Figure 5B:
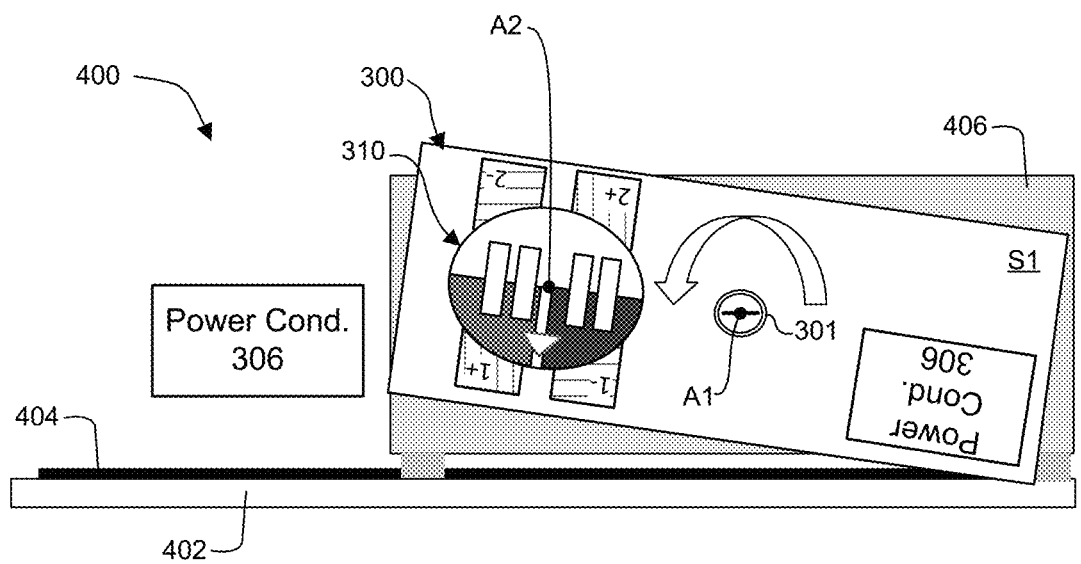
Figure 5C:
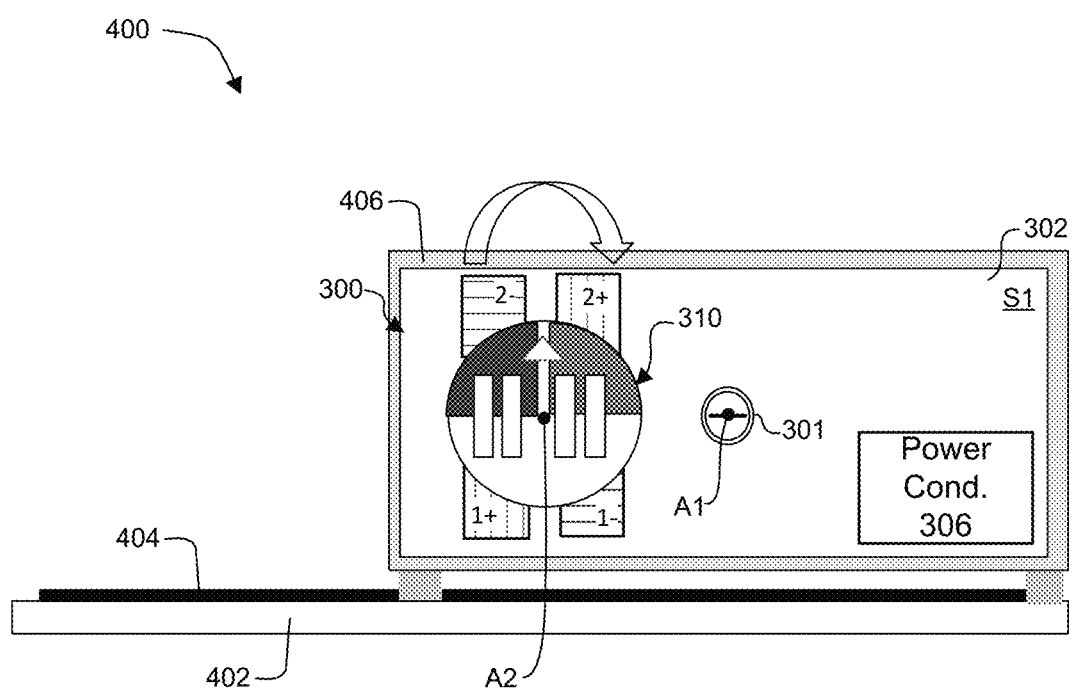

FIGS. 5A-5C together illustrate an embodiment of the operation of a power delivery module such as power delivery module 300. The views shown in these figures are views from the rear of a rack. In the illustrated embodiment, power deliver module 300 is rotatably attached to PDM chassis 406, with axis A1 normal to both board 302 and the PDM chassis. And, as described above, clip module 310 is rotatably coupled to board 302, so that clip module 310 rotates about axis A2, which is parallel to axis A1.

FIG. 5A illustrates a position of power delivery module 300 that would be suitable for use in a rack whose busbar is on the right side of the rack when viewed from behind, as shown in FIG. 2A. In this position, the power delivery module is coupled to a busbar by the power clips, which in turn are electrically coupled to electrical contacts 1+ and 1− on side S1 of board 302. To allow the server to be used with a rack whose busbar is in the middle of the rack (see FIG. 2B), power delivery module 300 is rotated 180 degrees about axis A1, from the position shown in FIG. 5A to the position shown in FIG. 5B. PDM chassis 406 is stationary and therefore does not rotate with power delivery module 300.

In the position shown in FIG. 5B, the power clips on power clip module 310 are moved where they can connect to the center busbar, but they remain electrically coupled to electrical contacts 1+ and 1− which, because of the rotation of module 300 between FIGS. 5A and 5B, are the wrong set of electrical contacts to make the proper positive-to-positive and negative-to-negative electrical connections to the busbar. To reorient the power clips so that they are correctly oriented and coupled to the correct set of electrical contacts (i.e., contacts 2+/2− in FIG. 5B) power clip module 310 is rotated 180 degrees, from the position of FIG. 5B to the position of FIG. 5C, with the installation symbol pointing upward. In the orientation of FIG. 5C, then, the power clips are in both the correct position and the correct orientation to make an appropriate connection between electrical contacts 2+/2− and a central busbar (see also FIGS. 6A-6C).

Figure 6A:
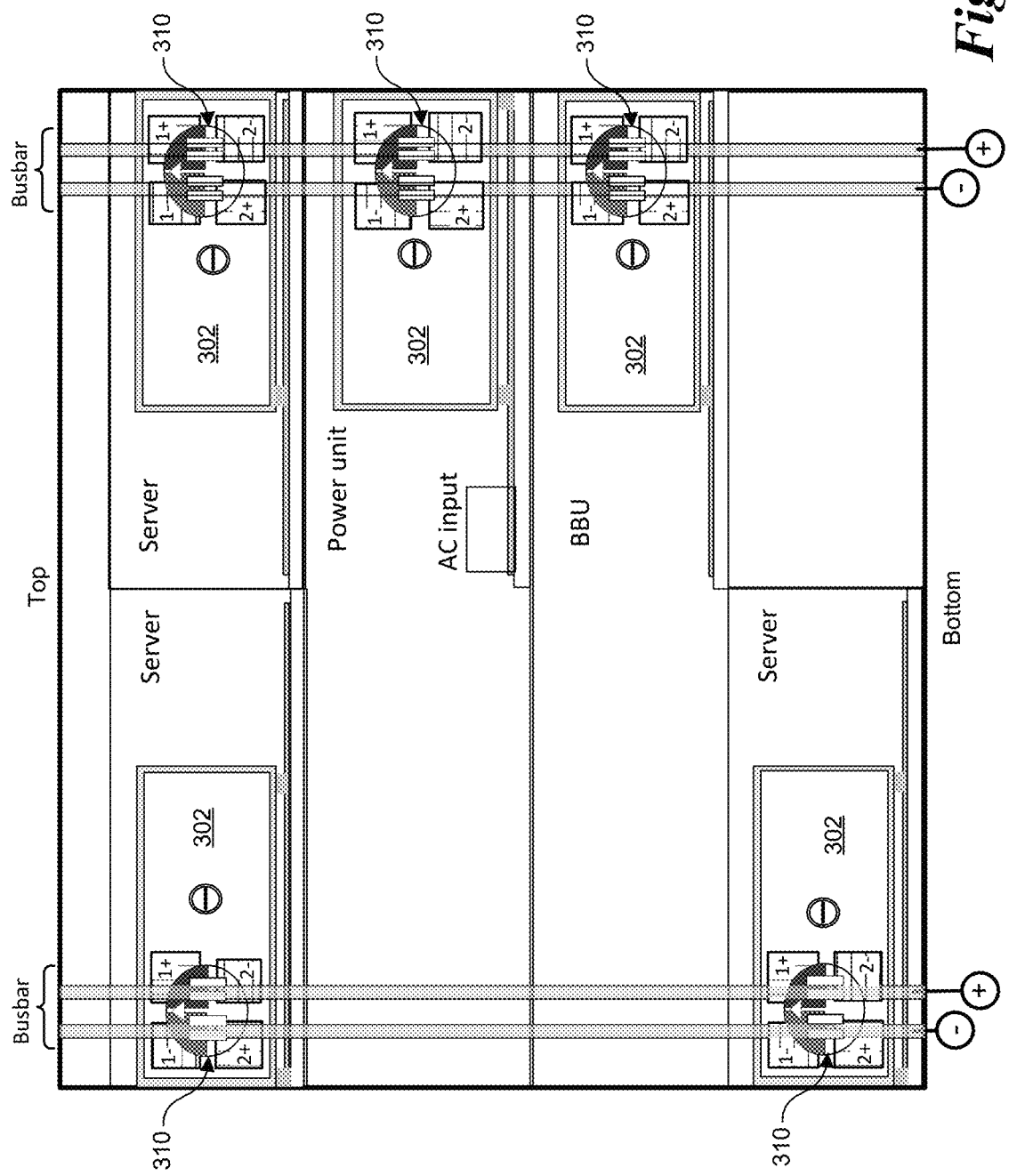
FIGS. 6A-6C are drawings of embodiments of racks using a power delivery module such as the one illustrated in FIGS. 3A-3G.
Figure 6B:
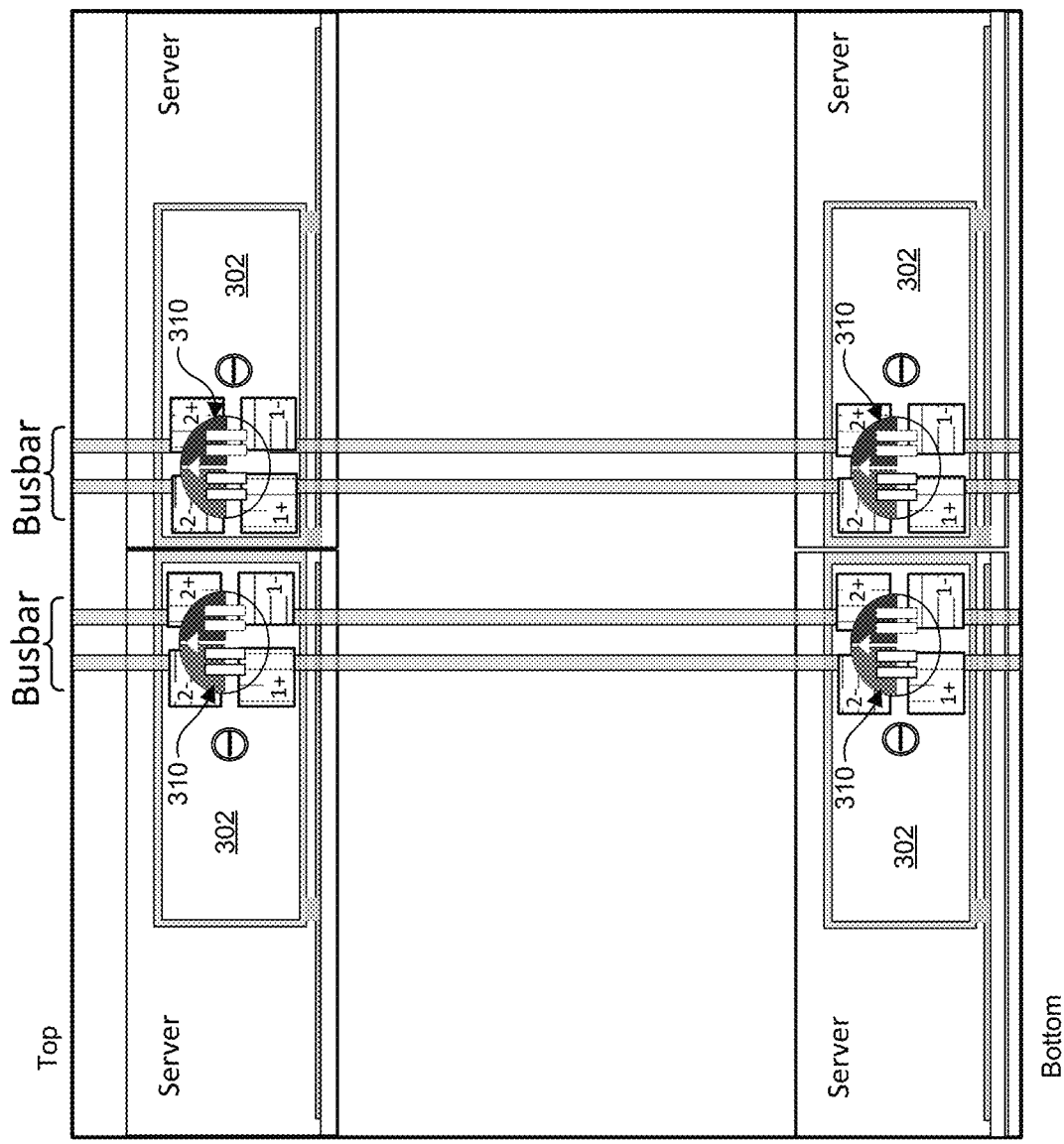
Figure 6C:
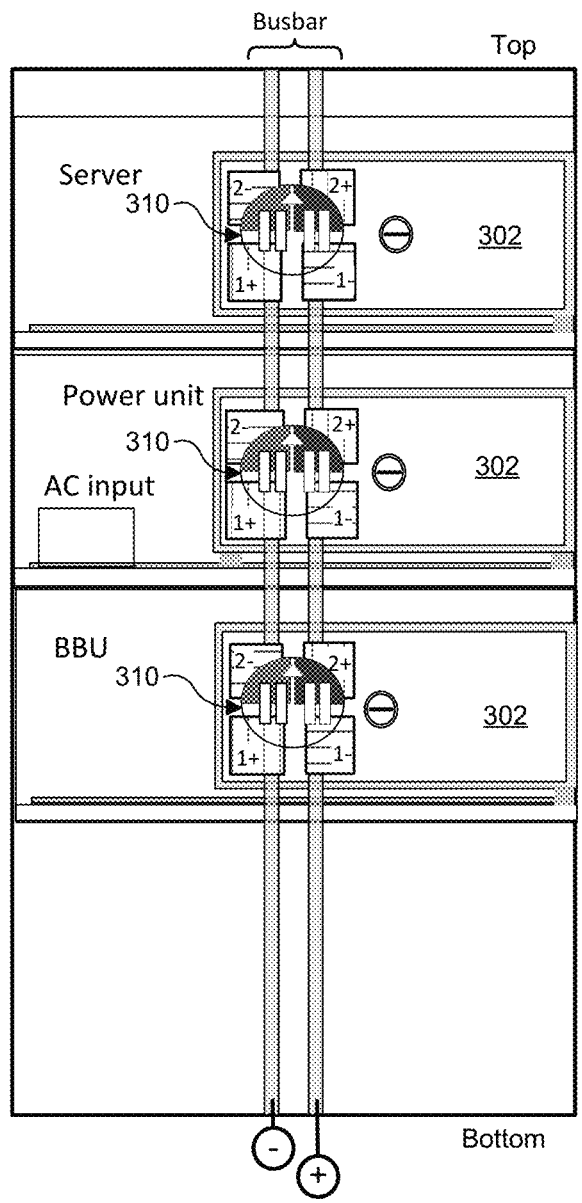

FIGS. 6A-6C illustrate a power delivery module, such as power delivery module 300, in different of rack configurations. The views shown are of the back of the rack, and the rack can be populated with different types of IT apparatus in addition to servers, such as a power supply unit (PSU) and a battery backup unit (BBU) to increase interoperability. Although in the illustrated embodiments the power delivery modules are drawn identically, in other embodiments not all power delivery modules used within a rack need be identical. If the main elements of the power delivery module are present—among other things, the electrical connectors, the power clip module, and the output connector—different pieces of IT equipment can use power delivery modules that vary in size, shape, placement of the axes, placement of the components, and so on. Moreover, because rotation dimension W3 can be different or can be designed to accommodate different rack configurations, it is also the case that different embodiments of the power delivery module can use different form factors for the power delivery module or for any of the components of the power delivery module.

FIG. 6A illustrates an embodiment of a high-density side-by-side or double-wide rack with busbars near its sides. In this embodiment, two different embodiments of power delivery module 300 can be used. For the IT equipment on the right, power delivery module 300, as shown in FIGS. 3A-3B, can be used. For the IT equipment on the left, the power delivery module is nearly the same as power delivery module 300; the main change is to move the electrical contacts 1+/1− and 2+/2−, as well as the power clip module 310, to the left side of the power deliver board 302 instead of the right. Note that the electrical contacts 1+/1− and 2+/2− retain their same positions relative to each other whether on the left or on the right.

FIG. 6B illustrates another configuration that can be used to support high density racks and different server configurations. Such system may more appropriate for edge computing systems and edge data center deployment. In the illustrated arrangement, starting from the arrangement in FIG. 6A, both the right-side and left-side power delivery boards 302 have been rotated 180 degrees so that their power clip modules 310 are positioned to couple with the more central busbars. All power clip modules 310 have also been rotated 180 degrees so that the installation symbol points upward and the power clip module is in the correct orientation for the power clips to be coupled to their corresponding busbar conductors.

FIG. 6C illustrates the result of rotating the right-side power delivery modules of FIG. 6A to be operable with a more central busbar. In the illustrated arrangement, power delivery boards 302, starting in the position shown in FIG. 6A, have been rotated 180 degrees (see FIGS. 5A-5B), so that power clip module 310 is positioned to couple with the more central busbar. Power clip module 310 has also been rotated 180 degrees (see FIGS. 5B-5C), so that the installation symbol points upward and the power clip module is in the correct orientation for the power clips to be coupled to their corresponding busbar conductors.

Other power delivery module embodiments are possible besides the ones described above. For instance:

The integration method of the clip module and PDB module can be different.

Additional structure maybe added to the power deliver modules and the clip module, to assist rotation.

The mounting method of the PDB chassis onto the IT chassis can be different including the fixing mechanisms.

The above description of embodiments is not intended to be exhaustive or to limit the invention to the described forms. Specific embodiments of, and examples for, the invention are described herein for illustrative purposes, but various modifications are possible.

What is claimed is:

1. A power delivery module comprising:
a power delivery board (PDB) adapted to be mounted to a power delivery module (PDM) chassis, the PDB having a first side and a second side and being rotatable relative to the PDM chassis about a first axis normal to the PDB between a first orientation and a second orientation;
a first pair of electrical contacts positioned on the first side, the first pair of electrical contacts including a first positive contact adjacent to a first negative contact;
a second pair of electrical contacts positioned on the first side and spaced apart from the first pair of electrical contacts, the second pair of electrical contacts including a second positive contact and a second negative contact; and
a power clip module coupled to the power delivery board, the power clip module including a pair of power clips adapted to electrically couple with the first pair of electrical contacts or the second pair of electrical contacts, wherein the power clip module is rotatable about a second axis that is parallel to and spaced apart from the first axis so that the power clip module can rotate between a first position where the pair of power clips are electrically coupled to the first pair of electrical contacts and a second position where the pair of power clips are electrically coupled to the second pair of electrical contacts.

2. The power delivery module of claim 1 wherein the power clip module comprises:

a clip module substrate having a first side and a second side;

a positive contact pad and a negative contact pad positioned on the first side of the clip module substrate so that they can be electrically coupled to the first pair of electrical contacts or the second pair of electrical contacts;

a positive power clip and a negative power clip, both positioned on the second side of the clip module substrate, wherein the positive power clip is electrically coupled to the positive contact pad and the negative power clip is electrically coupled to the negative contact pad; and a shaft coupled to the clip module substrate, wherein when the power clip module is coupled to the power delivery board the shaft is aligned with the second axis.

3. The power delivery module of claim 2 wherein the PDB further comprises a clip mounting channel adapted to rotatably receive the shaft, the mounting channel being positioned between the first and second pairs of electrical contacts.

4. The power delivery module of claim 2 wherein the clip module substrate is round and the positive and negative contact pads are pie-shaped segments electrically insulated from each other and positioned on the same half of the clip module substrate.

5. The power delivery module of claim 2 wherein the power clip module substrate is square and the positive and negative contact pads are quadrilateral and include buffer areas to account for misalignment between the positive and negative contact pads and their corresponding electrical contact.

6. The power delivery module of claim 2 wherein the power clip module further comprises a nut attached to the shaft, wherein the nut can be tightened to keep the power clip module in place or loosened to allow the power clip module to be rotated.

7. The power delivery module of claim 1 wherein the power clip module includes a visible indicator that, when pointed in a selected direction, indicate that the power clip module is in the correct orientation and properly integrated.

8. The power delivery module of claim 1, further comprising a rotatable connector mounted on the second side of the power deliver board, is aligned with the first axis, and is electrically coupled to both the first pair of electrical contacts and the second pair of electrical contacts.

9. The power delivery module of claim 8, further comprising power electronics electrically coupled between the rotatable connector and the first and second pairs of electrical contacts.

10. The power delivery module of claim 9 wherein the pair of power clips is electrically coupled to only one at a time of the first pair of electrical contacts or the second pair of electrical contacts.

11. An information technology (IT) apparatus comprising:
an IT chassis;
a main board mounted in the IT chassis and having electronic components thereon;
a power delivery module (PDM) chassis mounted to the IT chassis;
a power delivery module mounted to the power delivery module chassis, the power delivery module being electrically coupled to the main board and comprising:
a power delivery board (PDB) having a first side and a second side and being rotatable relative to the PDM chassis about a first axis normal to the PDB between a first orientation and a second orientation, a first pair of electrical contacts positioned on the first side, the first pair of electrical contacts including a first positive contact adjacent to a first negative contact, a second pair of electrical contacts positioned on the first side and spaced apart from the first pair of electrical contacts, the second pair of electrical contacts including a second positive contact and a second negative contact, and a power clip module coupled to the power delivery board, the power clip module including a pair of power clips adapted to electrically couple with the first pair of electrical contacts or the second pair of electrical contacts, wherein the power clip module is rotatable about a second axis that is parallel to and spaced apart from the first axis so that the power clip module can rotate between a first position where the pair of power clips are electrically coupled to the first pair of electrical contacts and a second position where the pair of power clips are electrically coupled to the second pair of electrical contacts; and a rotatable connector that is mounted on the second side of the power deliver board, is aligned with the first axis, and is electrically coupled to both the first pair of electrical contacts and the second pair of electrical contacts, wherein the rotatable connector electrically couples the power delivery module to the main board.

12. The information technology apparatus of claim 11 wherein the power clip module comprises:
a clip module substrate having a first side and a second side;
a positive contact pad and a negative contact pad positioned on the first side of the clip module substrate so that they can be electrically coupled to the first pair of electrical contacts or the second pair of electrical contacts;
a positive power clip and a negative power clip, both positioned on the second side of the clip module substrate, wherein the positive power clip is electrically coupled to the positive contact pad and the negative power clip is electrically coupled to the negative contact pad; and
a shaft coupled to the clip module substrate, wherein when the power clip module is coupled to the power delivery board the shaft is aligned with the second axis.

13. The information technology apparatus of claim 12 wherein the PDB further comprises a clip mounting channel adapted to rotatably receive the shaft, the mounting channel being positioned between the first and second pairs of electrical contacts.

14. The information technology apparatus of claim 12 wherein the clip module substrate is round and the positive and negative contact pads are pie-shaped segments electrically insulated from each other and positioned on the same half of the clip module substrate.

15. The information technology apparatus of claim 12 wherein the power clip module substrate is square and the positive and negative contact pads are quadrilateral and include buffer areas to account for misalignment between the positive and negative contact pads and their corresponding electrical contact.

16. The information technology apparatus of claim 12 wherein the power clip module further comprises a nut attached to the shaft, wherein the nut can be tightened to keep the power clip module in place or loosened to allow the power clip module to be rotated.

17. The information technology apparatus of claim 11 wherein the power clip module includes a visible indicator that, when pointed in a selected direction, indicate that the power clip module is in the correct orientation.

18. The information technology apparatus of claim 11, further comprising a rotatable connector mounted on the second side of the power deliver board, is aligned with the first axis, and is electrically coupled to both the first pair of electrical contacts and the second pair of electrical contacts.

19. The information technology apparatus of claim 18, further comprising power electronics electrically coupled between the rotatable connector and the first and second pairs of electrical contacts.

20. The information technology apparatus of claim 19 wherein the pair of power clips is electrically coupled to only one at a time of the first pair of electrical contacts or the second pair of electrical contacts.

* * * * *